US006724221B2

(12) United States Patent
Carballo et al.

(10) Patent No.: US 6,724,221 B2
(45) Date of Patent: Apr. 20, 2004

(54) CIRCUITRY HAVING EXCLUSIVE-OR AND LATCH FUNCTION, AND METHOD THEREFOR

(75) Inventors: Juan-Antonio Carballo, Austin, TX (US); David William Boerstler, Round Rock, TX (US); Jeffrey L. Burns, Austin, TX (US); Kevin John Nowka, Round Rock, TX (US); Li Shi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 10/112,513

(22) Filed: Mar. 28, 2002

(65) Prior Publication Data

US 2003/0184340 A1 Oct. 2, 2003

(51) Int. Cl.⁷ .................... H03K 19/21; H03K 19/177; H03K 3/356
(52) U.S. Cl. ................... 326/55; 326/44; 327/199
(58) Field of Search .............. 326/52, 55, 44; 327/199–201, 208, 212

(56) References Cited

U.S. PATENT DOCUMENTS

| | | | | |
|---|---|---|---|---|
| 4,710,650 A | * | 12/1987 | Shoji | 326/98 |
| 5,334,888 A | | 8/1994 | Bodas | 326/54 |
| 5,508,648 A | | 4/1996 | Banik | 327/203 |
| 5,523,707 A | | 6/1996 | Levy et al. | 326/52 |
| 5,625,308 A | | 4/1997 | Matsumoto et al. | 327/203 |
| 5,650,735 A | | 7/1997 | Ko | 326/93 |
| 5,736,868 A | | 4/1998 | Kim et al. | 326/55 |
| 5,751,649 A | | 5/1998 | Kornachuk et al. | 365/189.05 |
| 5,764,089 A | | 6/1998 | Partovi et al. | 327/200 |
| 5,825,225 A | | 10/1998 | Sugisawa et al. | 327/208 |
| 5,861,762 A | | 1/1999 | Sutherland | 326/55 |
| 6,084,455 A | | 7/2000 | Matson | 327/200 |
| 6,137,309 A | * | 10/2000 | Couteaux et al. | 326/55 |
| 6,292,407 B1 | | 9/2001 | Porter et al. | 326/30 |

OTHER PUBLICATIONS

Weste and Eshraghian, "Principles of CMOS VLSI Design", 2nd edition, Fig 5.55b, p. 328, 1993.
Weste and Eshraghian, "Principles of CMOS VLSI Design", 2nd edition, Fig 5.58, p. 331, 1993.
M. Abramovice et al., "Digital Systems Testing and Testable Design", IEEE Press, 1990, pp. 471–477.
U.S. patent application Ser. No. 09/848,165, Boerster et al., filed May 3, 2001.

* cited by examiner

Primary Examiner—Michael Tokar
Assistant Examiner—James Cho
(74) Attorney, Agent, or Firm—Anthony V. S. England; Casimer K. Salys

(57) ABSTRACT

In one form of the invention, circuitry having exclusive-OR and latch functionality includes timing circuitry and logic circuitry. The circuitry includes a memory, with first and second memory nodes, for storing a state and its complement, and first and second timing circuitry portions, each operable to receive at least one timing signal, coupled to the respective memory nodes. The logic circuitry includes first and second logic circuitry portions, each of which is operable to receive at least first and second data signals. Each of the logic circuitry portions is coupled in series with a conditionally conductive path of one of the respective first and second timing circuitry portions.

18 Claims, 5 Drawing Sheets

CIRCUITRY HAVING EXCLUSIVE-OR AND LATCH FUNCTION, AND METHOD THEREFOR

CROSS REFERENCE TO RELATED APPLICATION

This application is related to the following co-pending application, which has common inventorship, is assigned to the same assignee as the present application, and is hereby incorporated herein by reference:

Ser. No. 09/848,165, filed on May 3, 2001, "METHOD AND APPARATUS FOR LATCHING A CLOCKED DATA SIGNAL."

BACKGROUND

1. Field of the Invention

The present invention relates to logic functions and latches in electronic circuitry, and more particularly to such functions and latches which are suitable for application with a high frequency clock.

2. Related Art

Numerous electronic circuits applications require exclusive-OR ("XOR") logic interconnected with storage elements, such as latches. For example, fundamental elements of CMOS serial communications links, such as phase detectors, often have exclusive-OR gates connected to latches of flip flops. In another example, built in self test circuitry generally requires exclusive-OR gates in a linear feedback shift register block, in order to automatically generate test patterns. In yet another example, arithmetic blocks often require exclusive-OR functionality that ends in some sort of latch-based storage. As computer systems operate at higher and higher clock speeds there is an increasing need for faster and faster circuitry, including circuitry having the above described exclusive-OR logic functionality output to a latch.

SUMMARY

The foregoing need is addressed in the present invention. In one form of the invention, circuitry having exclusive-OR and latch functionality includes timing circuitry and logic circuitry. The circuitry includes a memory, with first and second memory nodes, for storing a state and its complement, and first and second timing circuitry portions, each operable to receive at least one timing signal, coupled to the respective memory nodes. The logic circuitry includes first and second logic circuitry portions, each of which is operable to receive at least first and second data signals. Each logic circuitry portion has a conditionally conducting path, coupled in series with a conditionally conductive path of one of the respective first and second timing circuitry portions, for controlling pulling up and pulling down the respective memory nodes responsive to the following conditions: i) the first data signal being asserted and the second data signal being de asserted and ii) the first data signal being de asserted and the second data signal being asserted.

In another aspect, the first timing circuitry portion has first pull up and pulldown sections, and the second timing circuitry portion has second pull up and pulldown sections. The logic circuitry portions are coupled in series with respective ones of the timing circuitry portions.

From the above is should be appreciated that the invention addresses the above described need by embedding logic circuitry within timing circuitry, in contrast with the prior art cascading of logic circuitry with a clocked latch. Circuitry is shared, and power, area and/or delay savings are achieved by thus integrating the logic and timing functions tightly. A high degree of delay symmetry is also achieved. Other advantages, objects, aspects and forms of the invention will become apparent upon reading the following detailed description and upon reference to the accompanying drawings.

DETAILED DESCRIPTION OF PREFERRED EMBODIMENT

The claims at the end of this application set out novel features which applicants believe are characteristic of the invention. The invention, a preferred mode of use, further objectives and advantages, will best be understood by reference to the following detailed description of an illustrative embodiment readin conjunction with the accompanying drawings.

Figure 1A:
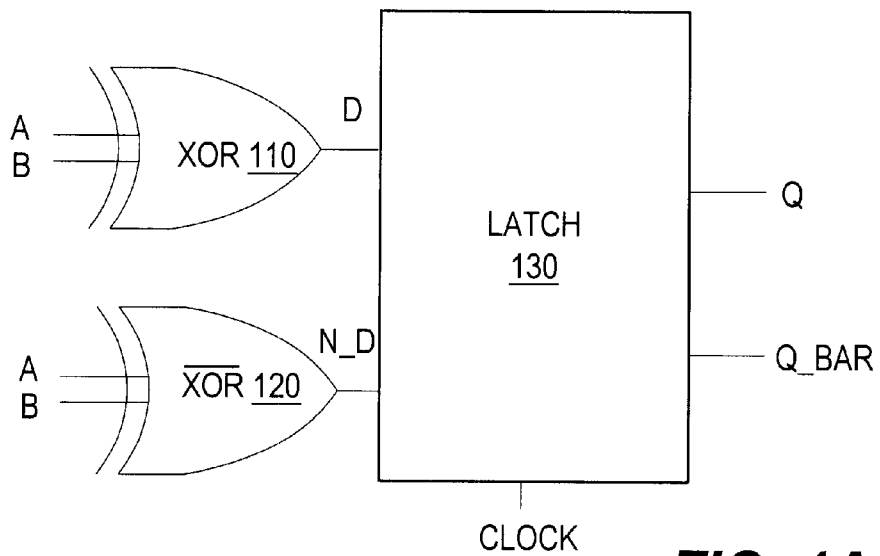
FIG. 1A illustrates circuitry for performing exclusive-OR and latch functions, according to the prior art.

Referring now to FIG. 1A, circuitry 100 is shown for performing exclusive-OR and latch functions, according to the prior art. The circuitry 100 includes first XOR circuitry 110 and second XOR circuitry 120, which each receive data signals A and B. (It should be understood that the XOR circuitry 110 and 120 may also receive data signals A_bar and B_bar, which are complements of the respective data signals A and B.) The data signals are coupled to the circuitry 110 and 120 in such a way (not explicitiy shown in FIG. 1A) that the circuitry 110 generates output "N_D" responsive to the states of the data signals. Likewise, circuitry 120 generates output "D," which is the complement of N_D, responsive to the states of the data signals.

The outputs of the XOR circuitry 110 and 120 are coupled to latch circuitry 130, which also receives a clock signal, as shown. Latch circuitry 130 samples its inputs, D and N_D, and asserts an output signal Q for a certain time interval, responsive to the clock signal, as is well known in the art.

Figure 1B:
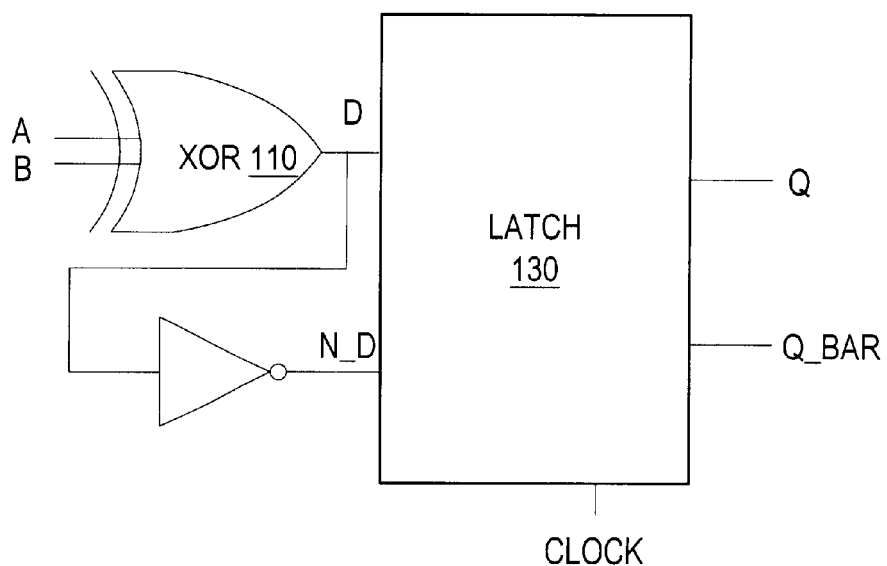
FIG. 1B illustrates alternative circuitry for performing exclusive-OR and latch functions, according to the prior art.

Referring now to FIG. 1B, circuitry 150 is shown for performing exclusive-OR and latch functions, according to the prior art. In this arrangement, instead of having independent XOR circuitry 120 the output N_D of XOR circuitry 110 is fed to an inverter 140 which generates output D.

Figure 2:
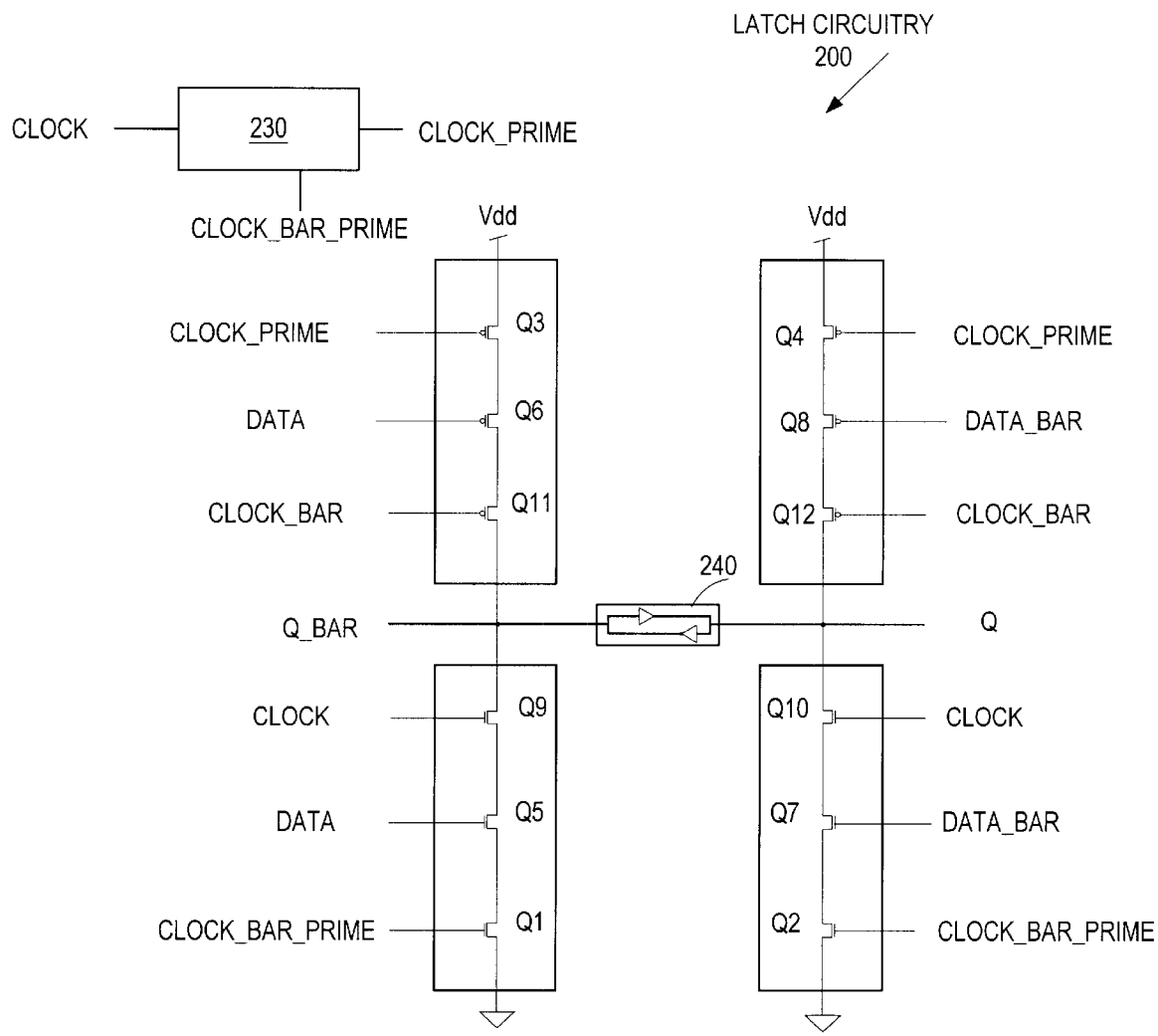
FIG. 2 illustrates latch circuitry, according to the above cross referenced, related patent application.

Referring now to FIG. 2, latch circuitry 200 is illustrated, according to the above cross referenced related patent application. The latch 200 includes a memory 240 with inverters. The memory 240 has a first node Q for storing a high or low state and a second node Q_bar for storing a state complementary to that of node Q. It should be noted that the states of the nodes Q and Q_bar may also be referred to as respective "output signals" Q and Q_bar for the latch 200.

In general, the state of a node may be referred to as an input or output signal. And, likewise, an input or output signal may be referred to as the state of a node. Also, it may be said that a state or signal is "asserted" or "deasserted" on the node.

It should also be noted that the term "asserted" and "deasserted" will be used in a specific context for the FIG's described herein, but that the terms should not be limited to only those specific examples. The terms are used to avoid confusion when dealing with the mixture of "active high" and "active low" logic signals. "Assert" is used to refer to the rendering of a logic signal or register bit or node into its active, or logically true state. "Deassert" is used to refer to the rendering of a logic signal or register bit or node into its inactive, or logically false state. Depending on whether circuitry is applied in the context of "active high" or "active low" logic, a signal that is "asserted" maybe either a high voltage or a low voltage, and a signal that is "deasserted" may be either a low voltage or a high voltage. Thus in one context, circuitry for asserting may be circuitry for pulling a node up, and in another context, circuitry for asserting may be circuitry for pulling a node down.

Timing related signals for the latch 200 are generated by delay circuitry 230 having an input node (not shown) for receiving a Clock signal. An embodiment of delay circuitry 230 is shown in detail in the related application. The delay circuitry 230 is operable to assert a first delay signal, Clock_bar_prime, responsive to the delay circuitry Clock signal, and a first delay interval. The first delay interval includes a delay $t_k$. That is, Clock_bar_prime is asserted following a time delay equal to the first delay interval after the start of the assertion of the circuitry Clock signal. The first delay interval is longer responsive to the Clock signal going high than to the Clock signal going low. A reason for this will be described further below.

The delay circuitry 230 is also operable to deassert a second delay signal, Clock_prime, responsive to the first delay signal and a second delay interval after the first delay signal is asserted. (Conversely, of course, the Clock_prime signal is asserted, with propagation delay, responsive to Clock_bar_prime being deasserted.) Note that since the second delay signal is triggered responsive to the first delay signal, it should be understood that an event triggered by the second delay signal is also responsive to the first delay signal and thus also to the first delay interval.

Regarding the control of output signals, when Clock falls, and its complement Clock_bar rises, this immediately turns off FET's Q9–12, and a short while later, at the first instance of a first delay interval, Clock-bar_prime is asserted, which turns on Q1 and Q2. Then, after a second delay interval, Clock_prime is deasserted, which turns on Q3 and Q4. However, since the FET's Q9–12 are off at this time, nodes Q and Q_bar are isolated for now, despite the turning on of Q1–4. Therefore, the nodes Q and Q_bar do not change state immediately when the data changes a short while later.

Then, after Data has gone high and Data_bar has gone low, when Clock goes high and Clock_bar goes low, node Q is immediately pulled up through FET's Q4, Q8 and Q12, gated, i.e., timed, by Clock_bar falling. Likewise, Q_bar is immediately pulled down through the FET's Q1, Q5 and Q9, gated by Clock rising.

Next, Clock_bar_prime falls responsive to Clock rising, at the second instance of the first delay interval. Then Clock_prime rises shortly thereafter responsive to Clock-bar_prime falling, at the second instance of the second delay interval. Clock_prime rising and Clock_bar_prime falling turns off Q1 through Q4, isolating nodes Q and Q_bar from Vdd and ground, so they are held by the memory 240 and make no further changes despite any change in Data.

The first delay interval, i.e., the interval from Clock changing state to Clock_bar_prime responsively changing state, is longer at the second instance than the first. This is because the first delay interval is responsive to the Clock signal rising at the second instance and responsive to the Clock signal falling at the first instance. This is advantageous since the longer delay permits the memory 240 nodes Q and Q_bar to be more fully driven to their respective states during the data capture window provided by the first delay interval before the memory 240 is isolated. Duration of the data capture window provided by the first delay interval is controlled by the time constant $t_k$. This window can be adjusted by changing $t_k$.

Next, when Clock again falls and Clock_bar rises, this again immediately turns off FET's Q9–12, and a short while later Clock_bar_prime is asserted turning on Q1 and Q2. Then, after the second delay interval, Clock_prime is deasserted, which turns on Q3 and Q4. Once again, since the FET's Q9–12 are off at this time by Clock and Clock_bar, nodes Q and Q_bar are again isolated despite the turning on of Q1–4. With the memory nodes isolated responsive to Clock and Clock_bar, the nodes Q and Q_bar do not change state responsive to the change in Data a short while later until Clock rises again and Clock_bar falls.

It should be understood that when Data is low and Clock goes high, Q_bar is pulled up through the FET's Q3, Q6 and Q11, gated by Clock_bar falling. Once again, Clock_prime is already low when Clock_bar falls, but Clock_prime rises shortly thereafter, responsive to Clock going high. Likewise, node Q is pulled down through the FET's Q2, Q7 and Q10, gated by Clock rising. Once again, Clock_bar_prime is already high when Clock rises, but Clock_bar_prime falls shortly thereafter, responsive to Clock going high. As before, Clock_prime rising and Clock_bar_prime falling isolates nodes Q and Q_bar from Vdd and ground, so they are held by the memory 240 and make no further changes despite any change in data. And, as before, when Clock falls, and Clock_bar rises, this immediately turns off FET's Q9–12, and a short while later Clock_bar_prime is asserted, and then Clock_prime is deasserted, which turns on Q1–4 again, but since the FET's Q9–12 are off, nodes Q and Q_bar remain isolated until the next clock cycle, when the Clock signal rises again.

Figure 3:
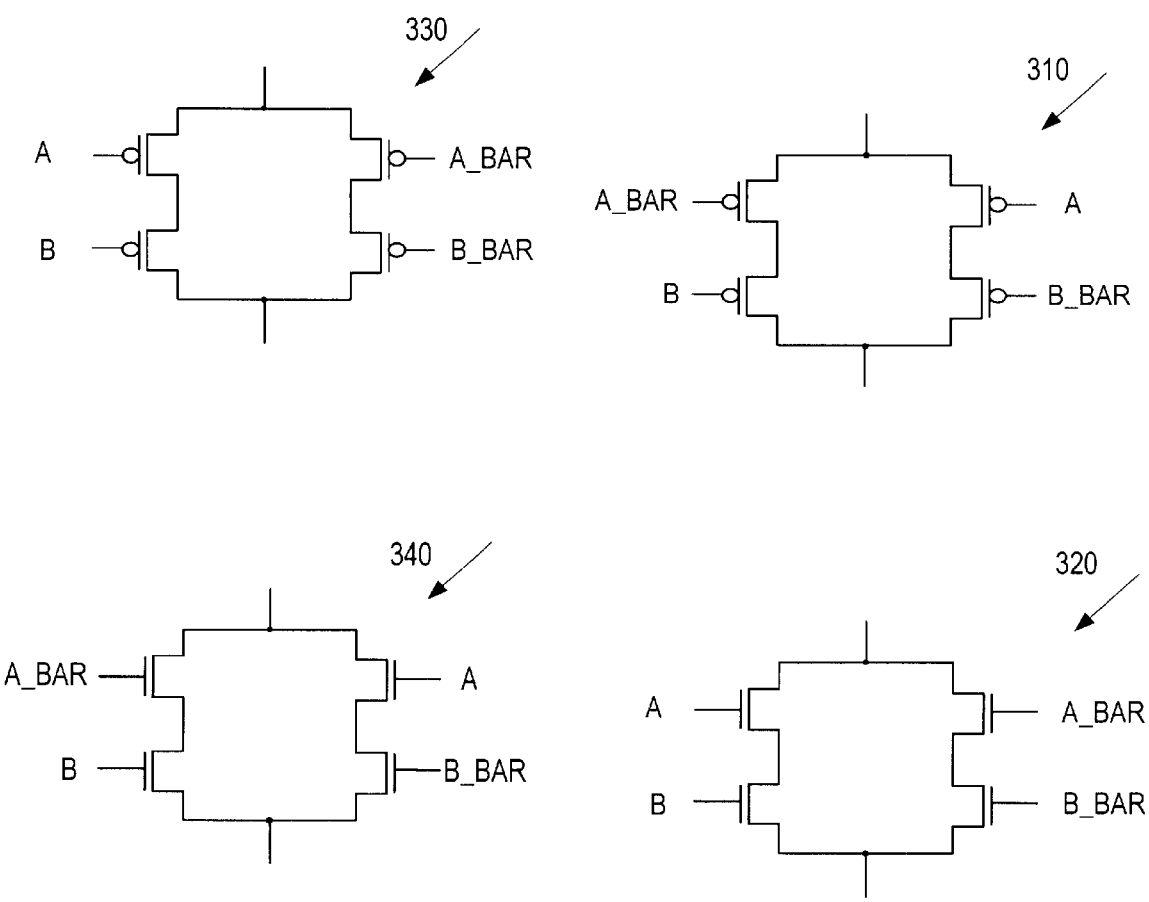
FIG. 3 illustrates first, second, third and fourth logic circuitry portions, according to an embodiment of the present invention.

Referring now to FIG. 3, first, second, third and fourth logic circuitry portions 310 through 340 are illustrated, according to an embodiment of the present invention. All of the logic circuitry portions 310 through 340 have two parallel sets of FET pairs, with the conducting electrodes of the FET's in the respective pairs connected in series. The gates of each FET pair receive a combination of data signals A and B or their complements. That is, one gate of the pair receives either A or its complement, A_bar while the other gate receives B or B_bar. All of the portions 310 through 340 function similarly insofar as each turns on or turns off a conditionally conducting path responsive solely to i) A being asserted and B being de asserted, or ii) A being de asserted and B being asserted.

The FET's in first logic circuitry portion 310 are all PFET's, and the data signals are applied to the PFET gates as shown so that a conditionally conducting PFET path, i.e., through one or the other of the PFET pairs, turns on responsive solely to the following two conditions: i) A is asserted and B is de asserted, and ii) A is de asserted and B is asserted. (Correspondingly, of course, the circuitry portion 310 turns off its conducting path responsive solely to the following two conditions: i) both A and B are asserted, and ii) both A and B are de asserted.)

The FET's in second logic circuitry portion 320 are all NFET's, and the data signals are applied to the NFET gates as shown so that a conditionally conducting NFET path, i.e., through one or the other of the NFET pairs, turns on responsive solely to the following two conditions: i) both A and B data are asserted, and ii) both A and B are de asserted. (Correspondingly, of course, the circuitry portion 320 turns off its conducting path responsive solely to the following two conditions: i) A is asserted and B is de asserted, and ii) A is de asserted and B is asserted.)

The FET's in third logic circuitry portion 330 are all PFET's, and the data signals are applied to the PFET gates as shown so that a conditionally conducting PFET path, i.e., through one or the other of the PFET pairs, turns on responsive solely to the following two conditions: i) both A and B data are asserted, and ii) both A and B are de asserted. (Correspondingly, of course, the circuitry portion 330 turns off its conducting path responsive solely to the following two conditions: i) A is asserted and B is de asserted, and ii) A is de asserted and B is asserted.)

The FET's in fourth logic circuitry portion 340 are all NFET's, and the data signals are applied to the NFET gates as shown so that a conditionally conducting NFET path, i.e., through one or the other of the NFET pairs, turns on responsive solely to the following two conditions: i) A is asserted and B is de asserted, and ii) A is de asserted and B is asserted. (Correspondingly, of course, the circuitry portion 330 turns off its conducting path responsive solely to the following two conditions: i) both A and B data are asserted, and ii) both A and B are de asserted.)

Figure 4:
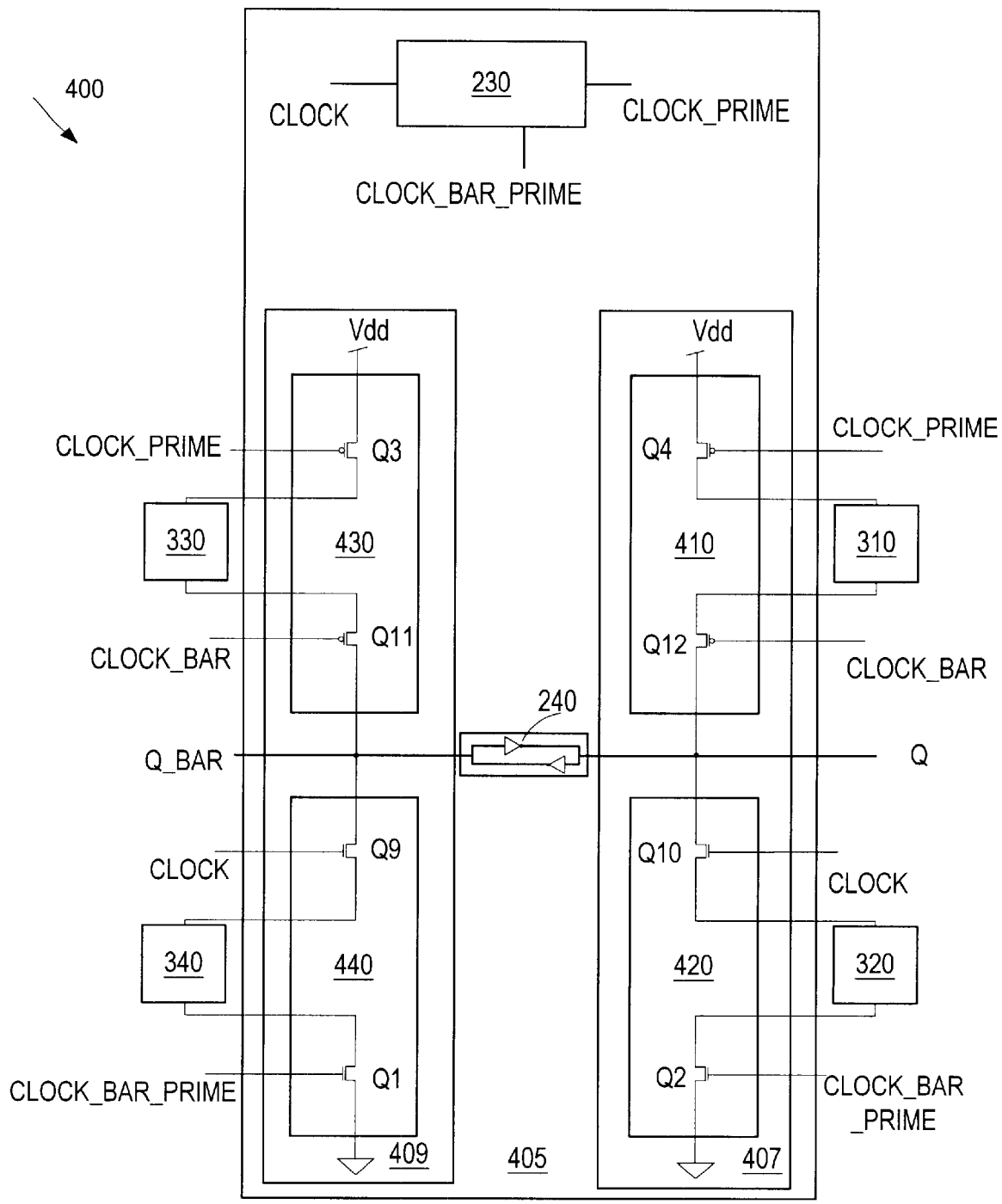
FIG. 4 illustrates circuitry for performing latching and XOR functions, according to an embodiment of the present invention.

Referring now to FIG. 4, circuitry 400 for performing latching and XOR functions is illustrated, according to an embodiment of the present invention. In one way of viewing circuitry 400, the circuitry includes certain aspects of latch circuitry 200 (FIG. 2), including the memory 240 and the delay circuitry 230, with logic circuitry portions 310 through 340 replacing respective data receiving FET's Q5 through Q8 of the latch circuitry 200.

Circuitry 400 has logic circuitry portions 310 through 340 "embedded" in timing circuitry portions. That is, in circuitry 400 each of the logic circuitry portions 310 through 340 are operable to receive at least first and second data signals A and B (and their complements, as shown in FIG. 3) and each has a conditionally conducting path, as described in connection with FIG. 3, coupled in series with a conditionally conductive path of one of the respective first and second timing circuitry portions 407 and 409. The conditionally conductive path of the first portion 407 includes the series-connected conducting electrodes of FET's Q2, Q10, Q12 and Q4. The conditionally conductive path of the second portion 409 includes the series-connected conducting electrodes of FET's Q1, Q9, Q11 and Q3. (It should be understood that the FET's in the timing circuitry do not necessarily need to be in exactly the locations as shown. For example, Q1 and Q9 and their associated timing signals could be interchanged, as could Q11 and Q3, etc. While the timing portions 407 and 409 control timing of pulling up and pulling down the respective memory nodes Q and Q_bar, the logic circuitry portions 310 through 340 are for controlling pulling up and pulling down the respective memory nodes Q and Q_bar responsive to the following conditions: i) A being asserted and B being de asserted and ii) A being de asserted and B being asserted.

Note that more particularly, the first and second timing circuitry portions 407 and 409 each have respective pull up and pull down sections. That is, portion 407 has a pull up section 410 and a pull down section 420. Portion 409 has a pull up section 430 and a pull down section 440. The logic circuitry portions 310 through 340 are coupled in series with respective ones of the timing circuitry portions 410 through 440. The first and third logic circuitry portions 310 and 330, coupled in series with the timing circuitry 405 pull up sections 410 and 430, have PFET's for the conditionally conducting paths for pulling up the memory nodes. The second and fourth logic circuitry portions 320 and 340, coupled in series with the timing circuitry 405 pull down sections 420 and 440, have NFET's for the conditionally conducting paths for pulling down the memory nodes.

The timing circuitry portions 410 through 440 each receive at least one timing signal. More specifically, the pull down sections 420 and 440 receive the clock signal, and the pull up sections 410 and 430 receive the complement clock signal, Clock_bar. Moreover, the circuitry 400 includes the delay circuitry 230 as in the latch circuitry 200 (FIG. 2) which receives the Clock signal and generates a delayed timing signal Clock_bar_prime and a complement of the delayed timing signal Clock_prime responsive thereto. The pull down sections 420 and 440 receive Clock_bar_prime, and the pull up sections receive Clock_prime.

From the above is should be appreciated that the invention addresses existing needs by embedding logic circuitry within timing circuitry, in contrast with the prior art cascading of logic circuitry with a clocked latch, e.g., FIGS. 1A and 1B. In the embodiment of FIG. 4, logic and timing circuitry is shared (as compared to circuitry 200, or as compared to FIGS. 1A and 1B) and power, area and/or delay savings are achieved by integrating the logic and timing functions tightly. A high degree of delay symmetry is also achieved in the generation of latched, complementary outputs, Q and Q_bar.

Figure 5:
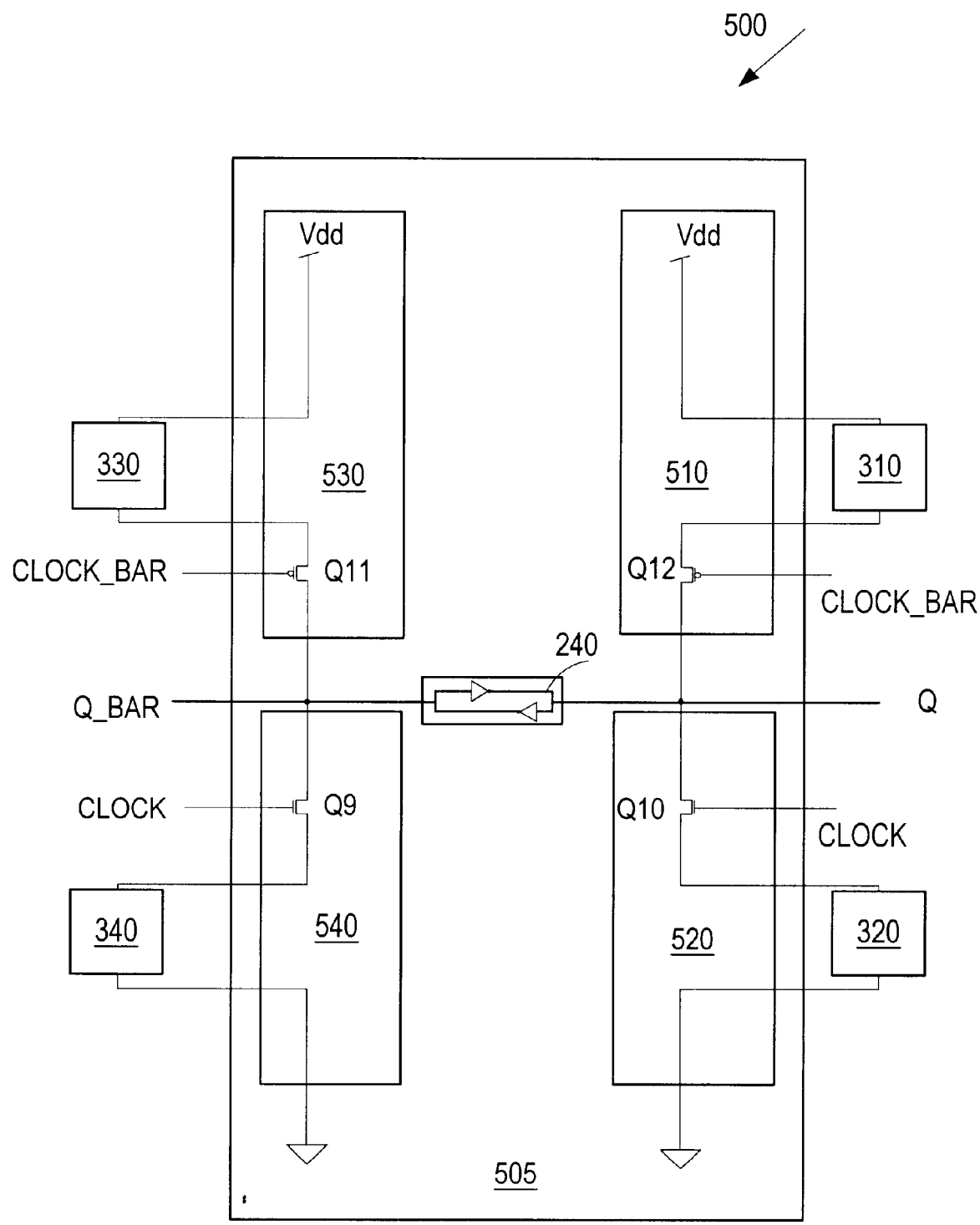
FIG. 5 shows circuitry according to an alternative embodiment of the present invention.

The description of the present embodiment has been presented for purposes of illustration, but is not intended to be exhaustive or to limit the invention to the form disclosed. Many additional aspects, modifications and variations are also contemplated and are intended to be encompassed within the scope of the following claims. For example, FIG. 5 shows circuitry 500, according to an alternative embodiment of the present invention. Circuitry 500 includes aspects of circuitry 400 (FIG. 4). In both circuitry 500 and circuitry 400 one of the output nodes is advantageously pulled up and the other is pulled down almost simultaneously, instead of one of the output nodes being driven by the other through the memory cell therebetween. In this way there is more symmetry in the switching of the two output nodes. Circuitry 500 differs from circuitry 400 in that timing circuitry 505 omits FET's Q1 through Q4 from each respective timing circuitry portion 510 through 540, and omits the delay circuitry 230. With this configuration, as long as the Clock signal is high, and Clock_bar is low, the circuitry 500 is transparent, i.e., a change in Data (and a corresponding change in Data_bar) can change the state of the memory nodes Q and Q_bar. This is in contrast to circuitry 400, which has a sampling aspect, according to which the circuitry 400 will respond to input data during a window of time.

In another alternative, according to one embodiment the circuitry of FIG. 5 is also applied with delay circuitry similar to that shown in FIGS. 3 and 4. The delay circuitry for the XOR circuitry 500 generates a short pulse and its complement responsive to a clock signal at its input. With this delay circuitry, the XOR circuitry 500 has the same type of transparency as the circuitry 400 of FIG. 4.

To reiterate, many additional aspects, modifications and variations are also contemplated and are intended to be encompassed within the scope of the following claims. Moreover, it should be understood that the following claims, and actions within the claims, do not necessarily have to be performed in the particular sequence in which they are set out.

What is claimed is:

1. Circuitry having exclusive-OR and latch functionality, comprising:
   timing circuitry having a memory for storing a state and its complement, and having first and second timing circuitry portions, each of the portions being operable to receive at least one timing signal and being coupled to respective first and second nodes of the memory for timing pulling up and pulling down of the memory nodes; and
   logic circuitry having logic circuitry portions, wherein each of the logic circuitry portions are operable to receive at least first and second data signals and each has a conditionally conducting path, coupled in series with a conditionally conductive path of one of the respective first and second timing circuitry portions, for controlling pulling up and pulling down the respective memory nodes responsive to the following conditions: i) the first data signal being asserted and the second data signal being de asserted or ii) the first data signal being de asserted and the second data signal being asserted.

2. The circuitry of claim 1, wherein the first and second timing circuitry portions each have respective pull up and pull down sections, and wherein the logic circuitry portions are coupled in series with respective ones of the timing circuitry portions.

3. The circuitry of claim 2, wherein the least one timing signal includes a clock signal and a complement of the clock signal, and the pull down sections of the first and second timing circuitry portions are operable to receive the clock signal, and the pull up sections of the first and second timing circuitry portions are operable to receive the complement clock signal.

4. The circuitry of claim 2, comprising delay circuitry operable to receive the clock signal and generate a delayed timing signal and a complement of the delayed timing signal responsive thereto, and wherein the pull down sections of the first and second timing circuitry portions are operable to receive the delayed timing signal, and the pull up sections of the first and second timing circuitry portions are operable to received the complement delayed timing signal.

5. The circuitry of claim 2, wherein a first one of the logic circuitry portions is coupled in series to the pull up section of the first timing circuitry portion, and the conditionally conducting path of the first logic circuitry portion has PFET's operable to turn on responsive solely to the following two conditions of the first and second data signals: i) the first data signal being asserted and the second data signal being de asserted or ii) the first data signal being de asserted and the second data signal being asserted, for pulling the first memory node up, and to turn off responsive solely to the following two conditions of the first and second data signals: i) both of the first and second data signals being asserted, or ii) both of the first and second data signals being de asserted, for permitting the first memory node to be pulled down.

6. The circuitry of claim 5, wherein a second one of the logic circuitry portions is coupled in series to the pull down section of the first timing circuitry portion, and the conditionally conducting path of the first logic circuitry portion has NFET's operable to turn on responsive solely to the following two conditions of the first and second data signals: i) both of the first and second data signals being asserted, and ii) both of the first and second data signals being de asserted, for pulling the first memory node down, and to turn off responsive solely to the following two conditions of the first and second data signals: i) the first data signal being asserted and the second data signal being de asserted and ii) the first data signal being de asserted and the second data signal being asserted, for permitting the first memory node to be pulled up.

7. The circuitry of claim 6, wherein a third one of the logic circuitry portions is coupled in series to the pull up section of the second timing circuitry portion, and the conditionally conducting path of the fourth logic circuitry portion has PFET's operable to turn on responsive solely to the following two conditions of the first and second data signals: i) both of the first and second data signals being asserted, or ii) both of the first and second data signals being de asserted, for pulling the second memory node up, and to turn off responsive solely to the following two conditions of the first and second data signals: i) the first data signal being asserted and the second data signal being de asserted or ii) the first data signal being de asserted and the second data signal being asserted, for permitting the second memory node to be pulled down.

8. The circuitry of claim 7, wherein a fourth one of the logic circuitry portions is coupled in series to the pull down section of the second timing circuitry portion, and the conditionally conducting path of the third logic circuitry portion has NFET's operable to turn on responsive solely to the following two conditions of the first and second data signals: i) the first data signal being asserted and the second data signal being de asserted or ii) the first data signal being de asserted and the second data signal being asserted, for pulling the second memory node down, and to turn off responsive solely to the following two conditions of the first and second data signals: i) both of the first and second data signals being asserted, or ii) both of the first and second data signals being de asserted, for permitting the second memory node to be pulled up.

9. The circuitry of claim 8, wherein the least one timing signal includes a clock signal and a complement of the clock signal, and the pull down sections of the first and second timing circuitry portions are operable to receive the clock signal, and the pull up sections of the first and second timing circuitry portions are operable to receive the complement clock signal.

10. The circuitry of claim 9, comprising delay circuitry operable to receive the clock signal and generate a delayed timing signal and a complement of the delayed timing signal responsive thereto, and wherein the pull up sections of the first and second timing circuitry portions are operable to receive the delayed timing signal, and the pull down sections of the first and second timing circuitry portions are operable to received the complement delayed timing signal.

11. A method in logic circuitry comprising the steps of:
   storing a state and its complement in a memory, wherein first and second portions of timing circuitry, each being coupled to a respective one of the nodes of the memory, receive at least one timing signal for timing pulling up and pulling down the respective memory nodes;
   receiving at least first and second data signals by logic circuitry portions, each logic circuitry portion having a conditionally conducting path coupled in series with a conditionally conductive path of one of the respective first and second timing circuitry portions; and pulling up and pulling down the respective memory nodes responsive to the following conditions: i) the first data signal being asserted and the second data signal being de asserted or ii) the first data signal being de asserted and the second data signal being asserted.

12. The method of claim 11, wherein the first and second timing circuitry portions each have respective pull up and pull down sections, and wherein the logic circuitry portions are coupled in series with respective ones of the timing circuitry portions.

13. The method of claim 12, wherein the least one timing signal includes a clock signal and a complement of the clock signal, the method comprising:

receiving the clock signal by the timing circuitry pull down sections; and receiving the complement of the clock signal by the timing circuitry pull up sections.

14. The method of claim 12, comprising:

receiving the clock signal by delay circuitry and generating a delayed timing signal and a complement of the delayed timing signal responsive thereto;

receiving the delayed timing signal by the timing circuitry pull up sections; and receiving the complement delayed timing signal by the timing circuitry pull down sections.

15. The method of claim 11, wherein a first one of the logic circuitry portions is coupled in series with the pull up section of the first timing circuitry portion, and the conditionally conducting path of the first logic circuitry portion has PFET's, the method comprising:

turning on the conditionally conducting path of the first logic circuitry portion responsive solely to the following two conditions of the first and second data signals: i) the first data signal being asserted-and the second data signal being de asserted or ii) the first data signal being de asserted and the second data signal being asserted, for pulling the first memory node up, and turning off the conditionally conducting path of the first logic circuitry portion responsive solely to the following two conditions of the first and second data signals: i) both of the first and second data signals being asserted, or ii) both of the first and second data signals being de asserted, for permitting the first memory node to be pulled down.

16. The method of claim 15, wherein a second one of the logic circuitry portions is coupled in series with the pull down section of the first timing circuitry portion, and the conditionally conducting path of the first logic circuitry portion has NFET's, the method comprising:

turning on the conditionally conducting path of the second logic circuitry portion responsive solely to the following two conditions of the first and second data signals: i) both of the first and second data signals being asserted, or ii) both of the first and second data signals being de asserted, for pulling the first memory node down, and turning off the conditionally conducting path of the first logic circuitry portion responsive solely to the following two conditions of the first and second data signals: i) the first data signal being asserted and the second data signal being de asserted or ii) the first data signal being de asserted and the second data signal being asserted, for permitting the first memory node to be pulled up.

17. The method of claim 16, wherein a third one of the logic circuitry portions is coupled in series with the pull up section of the second timing circuitry portion, and the conditionally conducting path of the third logic circuitry portion has PFET's, the method comprising:

turning on the conditionally conducting path of the third logic circuitry portion responsive solely to the following two conditions of the first and second data signals: i) both of the first and second data signals being asserted, or ii) both of the first and second data signals being de asserted, for pulling the second memory node up, and turning off the conditionally conducting path of the first logic circuitry portion responsive solely to the following two conditions of the first and second data signals: i) the first data signal being asserted and the second data signal being de asserted or ii) the first data signal being de asserted and the second data signal being asserted, for permitting the second memory node to be pulled down.

18. The method of claim 17, wherein a fourth one of the logic circuitry portions is coupled in series with the pull down section of the second timing circuitry portion, and the conditionally conducting path of the fourth logic circuitry portion has NFET's, the method comprising:

turning on the conditionally conducting path of the fourth logic circuitry portion responsive solely to the following two conditions of the first and second data signals: i) the first data signal being asserted and the second data signal being de asserted or ii) the first data signal being de asserted and the second data signal being asserted, for pulling the second memory node down, and turning off the conditionally conducting path of the first logic circuitry portion responsive solely to the following two conditions of the first and second data signals: i) both of the first and second data signals being asserted, or ii) both of the first and second data signals being de asserted, for permitting the second memory node to be pulled up.

* * * * *